(12) United States Patent
Kim et al.

(10) Patent No.: US 8,187,952 B2
(45) Date of Patent: May 29, 2012

(54) METHOD FOR FABRICATING SEMICONDUCTOR DEVICE

(75) Inventors: Uk Kim, Gyeonggi-do (KR); Sang-Oh Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 343 days.

(21) Appl. No.: 12/647,016

(22) Filed: Dec. 24, 2009

(65) Prior Publication Data

US 2011/0104894 A1 May 5, 2011

(30) Foreign Application Priority Data

Oct. 30, 2009 (KR) .......................... 10-2009-0104675

(51) Int. Cl.
*H01L 21/76* (2006.01)
(52) U.S. Cl. .................. 438/453; 257/E21.629
(58) Field of Classification Search .................. 438/268, 438/444–447, 453; 257/E21.629, E21.643, 257/E21.676
See application file for complete search history.

(56) References Cited

U.S. PATENT DOCUMENTS 7,355,230 B2 * 4/2008 Thies et al. .................. 257/296

FOREIGN PATENT DOCUMENTS

| KR | 1020030089740 | 11/2003 |
| KR | 1020060000275 | 1/2006 |
| KR | 1020090121004 | 11/2009 |
| KR | 1020100080243 | 7/2010 |

OTHER PUBLICATIONS

Notice of Allowance issued from Korean Intellectual Property Office on Nov. 9, 2011.

* cited by examiner

*Primary Examiner* — Quoc Hoang
(74) *Attorney, Agent, or Firm* — IP & T Group LLP

(57) ABSTRACT

A method for fabricating a semiconductor device includes etching a semiconductor substrate using a hard mask layer as a barrier to form a trench defining a plurality of active regions, forming a gap-fill layer to gap-fill a portion of the inside of the trench so that the hard mask layer becomes a protrusion, forming spacers covering both sides of the protrusion, removing one of the spacers using a doped etch barrier as an etch barrier, and etching the gap-fill layer using a remaining spacer as an etch barrier to form a side trench exposing one side of the active region.

14 Claims, 10 Drawing Sheets

METHOD FOR FABRICATING SEMICONDUCTOR DEVICE

CROSS-REFERENCE(S) TO RELATED APPLICATIONS

The present application claims priority of Korean Patent Application No. 10-2009-0104675, filed on Oct. 30, 2009, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with a buried bitline connected to one side contact.

Traditional planar metal oxide semiconductor field effect transistors (MOSFETs) have reached physical limitations in further improving performance with respect to leakage current, on-current, short channel effect, and so on. Thus, miniaturization of such traditional planar MOSFETs is also reaching limits. Thus, semiconductor devices using vertical channels rather than planar channels are being developed as a replacement.

In the fabrication of a semiconductor device using a vertical channel, a surround type gate electrode (also referred to as a vertical gate) is formed to surround an active pillar extending vertically on a semiconductor substrate. A source region and a drain region are formed over and below the active pillar. In this way, the semiconductor device with the vertical channel may be fabricated.

FIG. 1 is a cross-sectional view of a conventional semiconductor device with a vertical channel.

Referring to FIG. 1, a plurality of pillar structures each including an active pillar 12 and a hard mask layer 13 are formed on a substrate 11. The active pillar 12 extends vertically on the substrate 11. A gate dielectric layer 14 and a vertical gate 15 are formed to surround the outer wall of the active pillar 12, and a buried bitline (BBL) 16 is formed by implanting impurity ions into the substrate 11. An interlayer dielectric layer 18 is buried in a trench 17 to isolate adjacent bitlines 16 from each other.

In order to form the buried bitline 16 buried below the vertical gate 15, an ion implantation process may be performed to implant dopant. As the semiconductor device is further miniaturized, however, the implantation of dopant is reaching limits in reducing the resistance of the bitline 16 and thus, is leading to degradation in characteristics of the semiconductor device.

SUMMARY OF THE INVENTION

An embodiment of the present invention is directed to a method for fabricating a semiconductor device, which is advantageous to a high speed operation because of the reduced resistance of a buried bitline.

In accordance with an embodiment of the present invention, a method for fabricating a semiconductor device includes: etching a semiconductor substrate using a hard mask layer as a barrier to form a trench defining a plurality of active regions; forming a gap-fill layer to gap-fill a portion of the inside of the trench so that the hard mask layer becomes a protrusion; forming spacers covering both sides of the protrusion; removing one of the spacers using a doped etch barrier as an etch barrier; and etching the gap-fill layer using a remaining spacer as an etch barrier to form a side trench exposing one side of the active region.

The doped etch barrier may include a doped polysilicon layer.

The doped etch barrier may be formed to cover one of the spacers throughout an undoped polysilicon layer deposition process, a tilt ion implantation process, and a wet etch process.

The tilt ion implantation process may use boron (B) as a dopant.

The forming of the spacers may comprise forming an insulation layer over a resulting structure with the protrusion after the forming of the gap-fill layer and etching the insulation layer by a space etch process to form the spacers on both sides of the protrusion.

The insulation layer may comprise an oxide layer.

The oxide layer may be deposited at a temperature ranging from approximately room temperature to approximately 400° C.

The oxide layer may be deposited using a chemical vapor deposition (CVD) process or an atomic layer deposition (ALD) process.

The spacer etch process may be performed using a carbon fluoride gas and an oxygen gas as a main gas.

The spacer etch process may be performed using one of $N_2$, COS, $SO_2$, CO, and Ar as an additive gas.

The method may further comprise, after the spacer etch process, performing a wet cleaning for removing a residue.

The wet cleaning process may be performed using one of $NH_4OH$, $H_2SO_4$, and $H_2O_2$.

The method may further comprise, before forming the spacers, forming a liner nitride layer over a resulting structure with the protrusion after the forming of the gap-fill layer.

The method may further comprise, after forming the side trench, forming a contact region opening on one side of the active region, which is exposed by the side trench, forming a side contact buried in the contact region and forming a buried bitline connected to the side contact and filling a portion of the side trench.

DESCRIPTION OF SPECIFIC EMBODIMENTS

Figure 1:
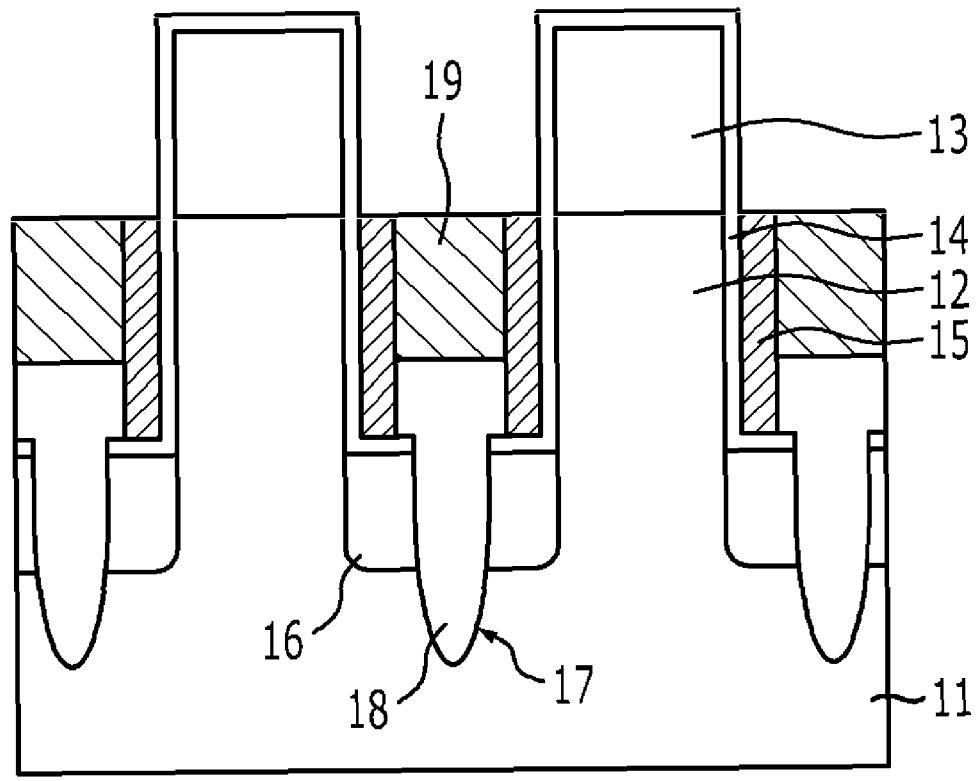
FIG. 1 is a cross-sectional view of a conventional semiconductor device with a vertical channel.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In accordance with exemplary embodiments of the present invention, a metallic buried bitline (BBL) is buried in a trench between active regions. One side contact (OSC) for an ohmic contact between the buried bitline and the active region is formed using metal silicide.

By contacting the bitline with the one side contact, a 1-cell 1-bitline structure may be provided. Hence, high integration of the semiconductor device may be achieved.

Figure 2A:
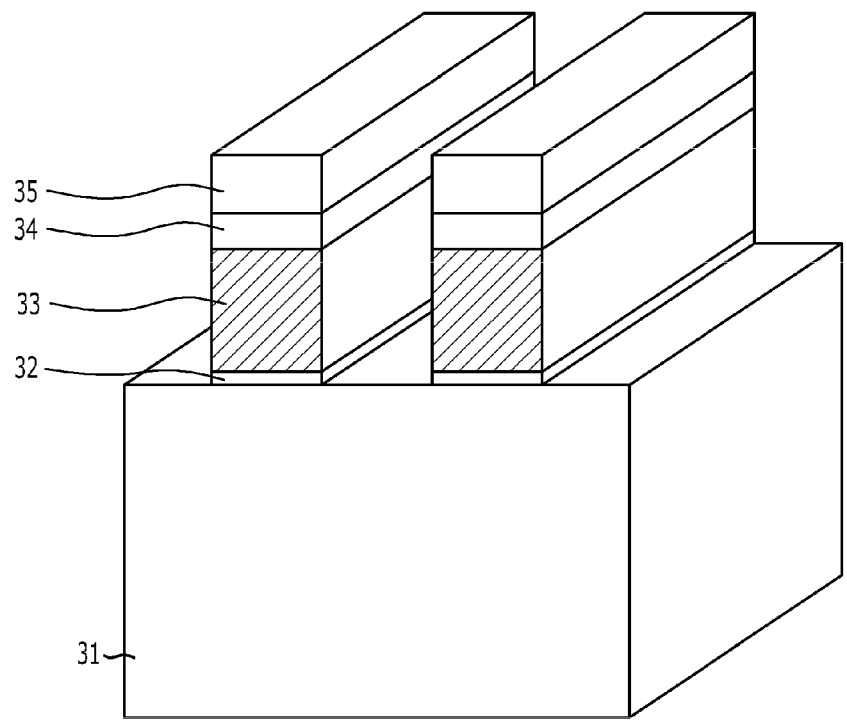
FIGS. 2A to 2Q are cross-sectional perspective views illustrating a method for forming a buried bitline of a semiconductor device in accordance with an embodiment of the present invention.
Figure 2B:
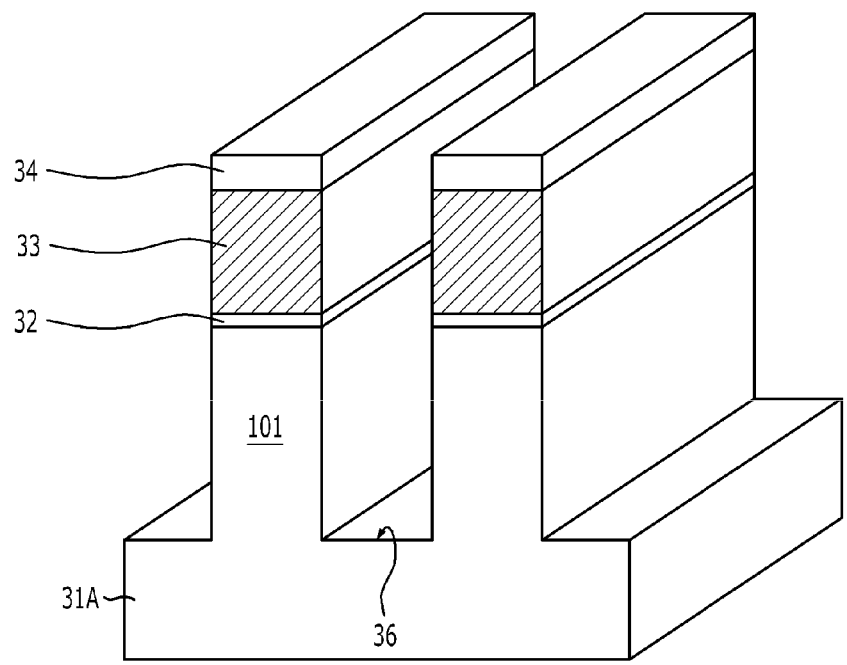
Figure 2C:
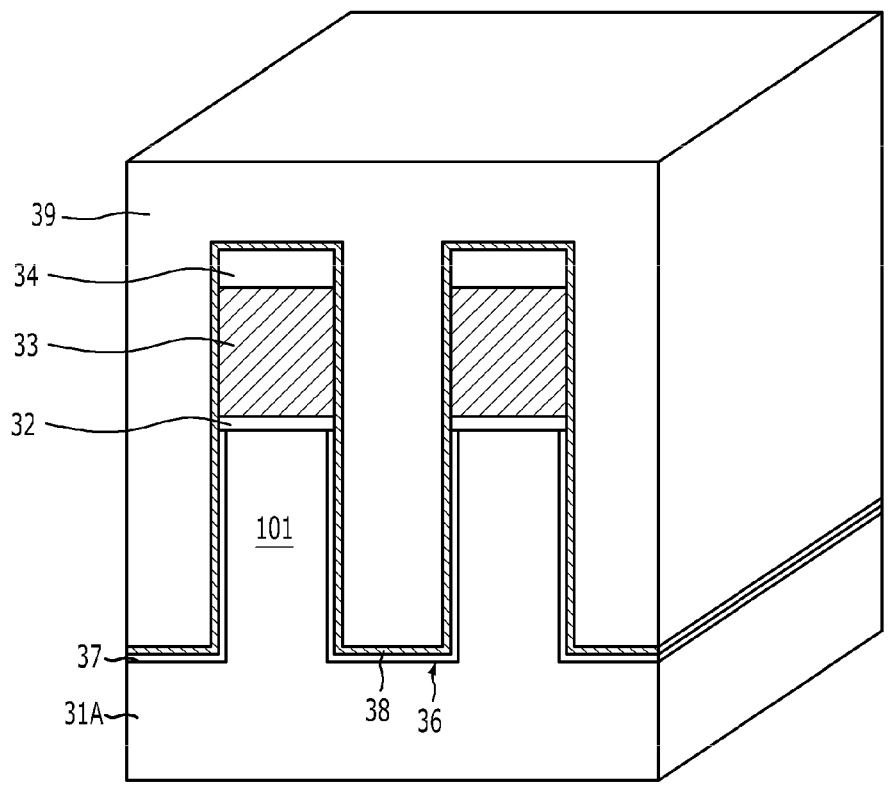
Figure 2D:
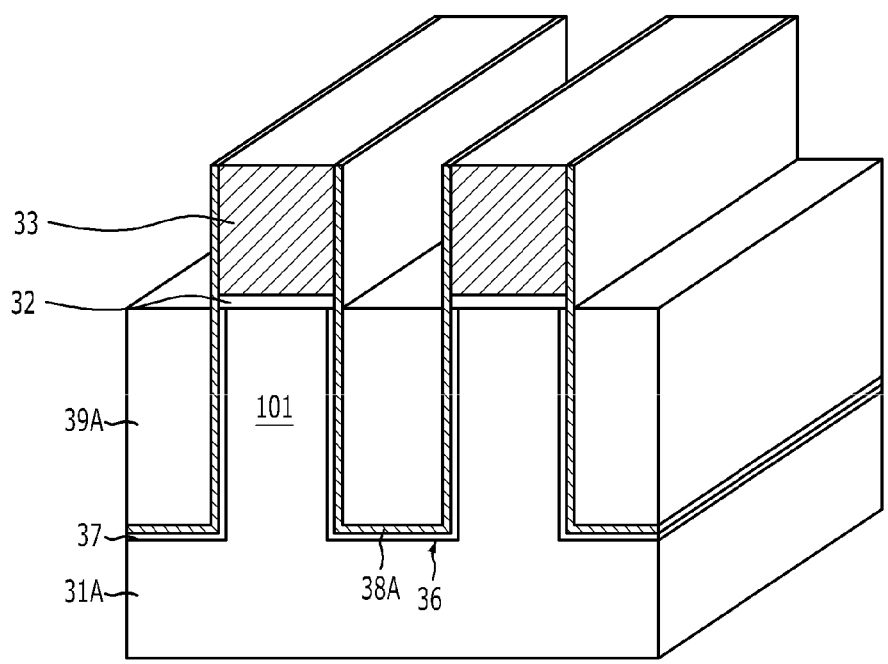
Figure 2E:
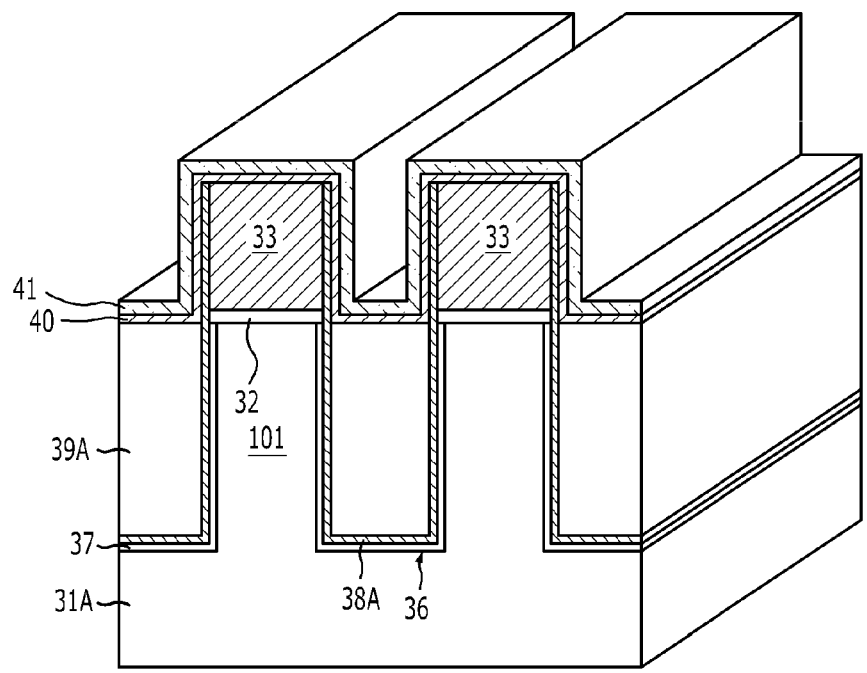
Figure 2F:
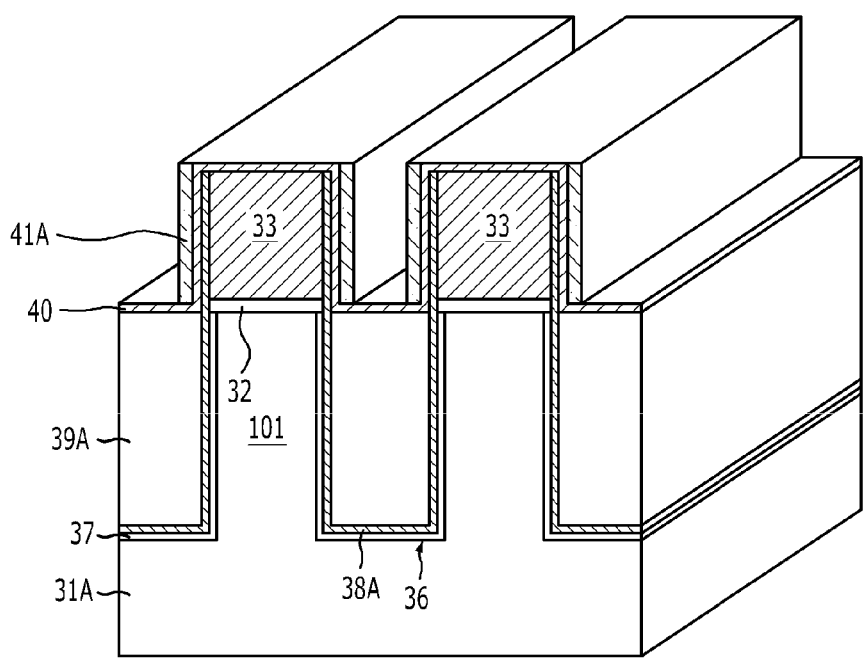
Figure 2G:
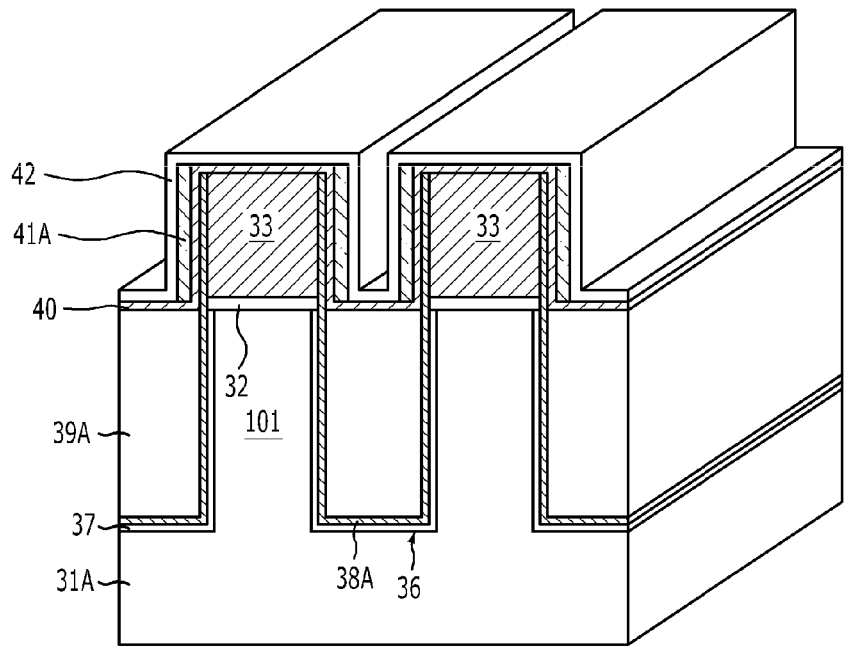
Figure 2H:
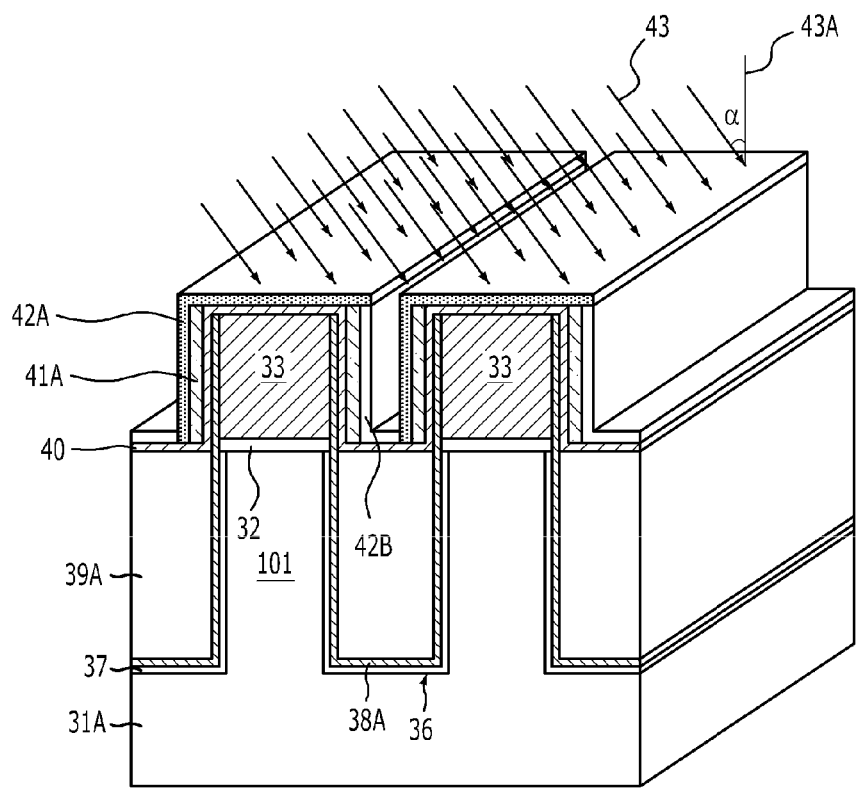
Figure 2I:
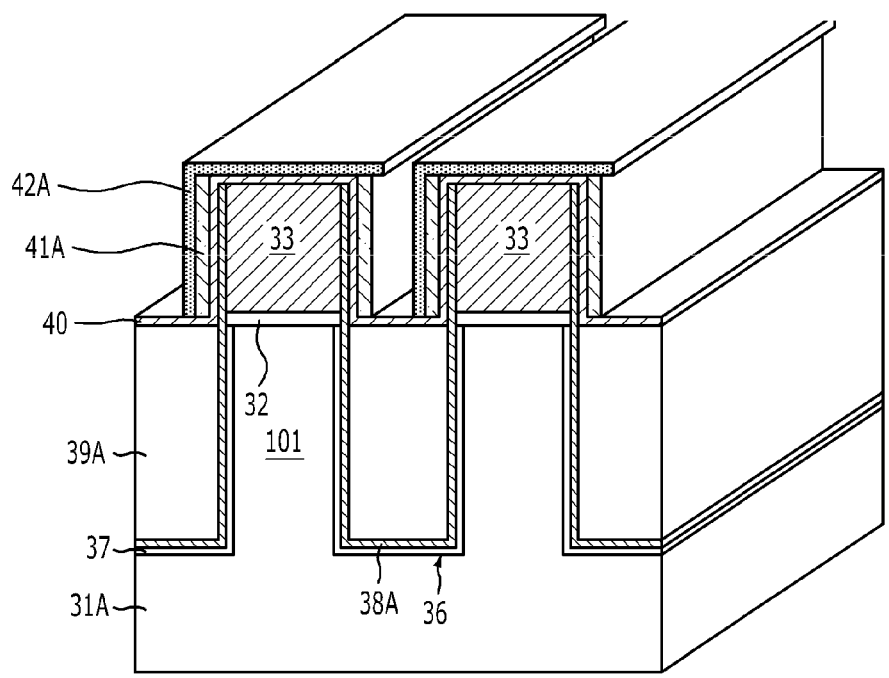
Figure 2J:
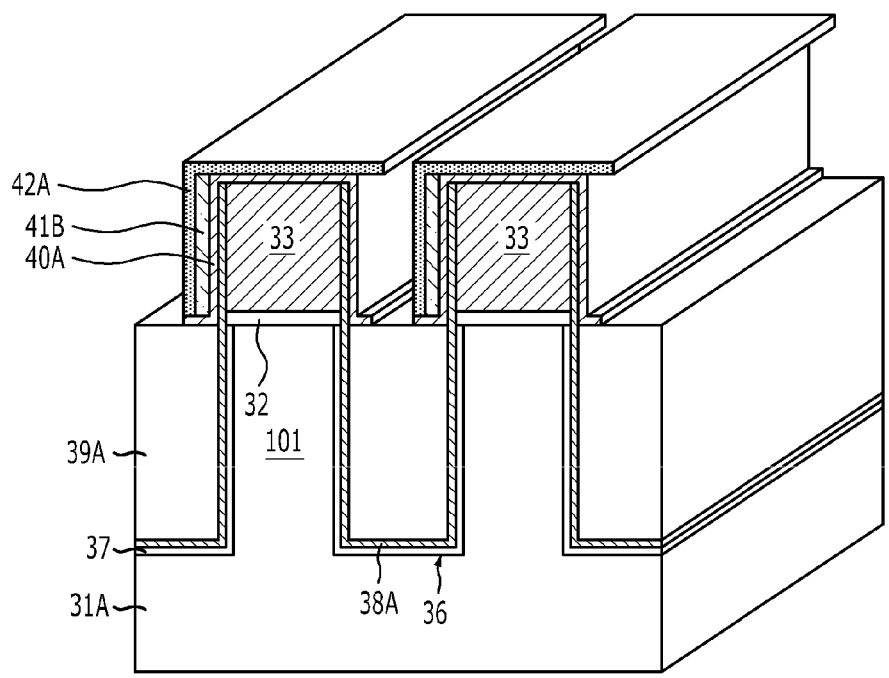
Figure 2K:
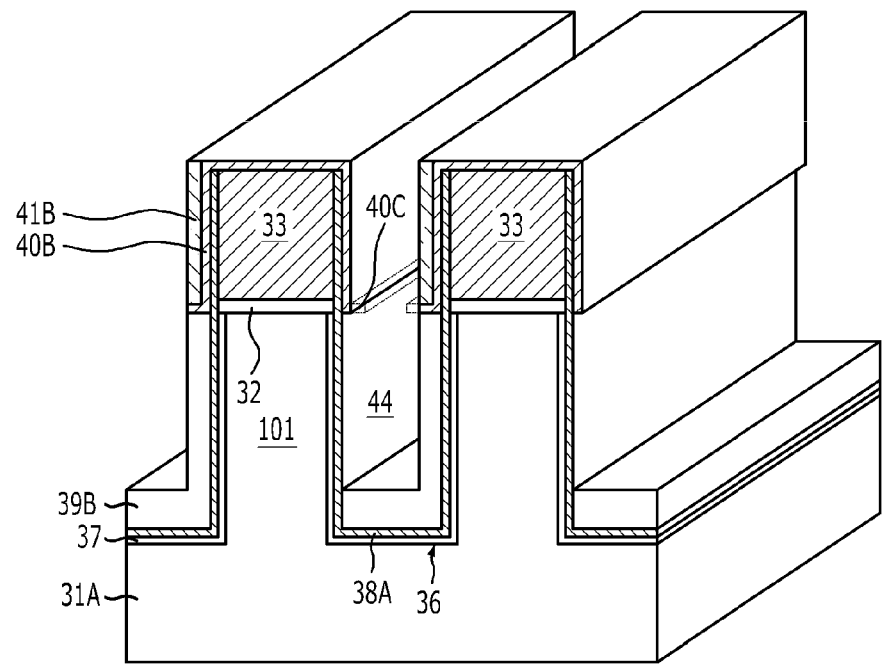
Figure 2L:
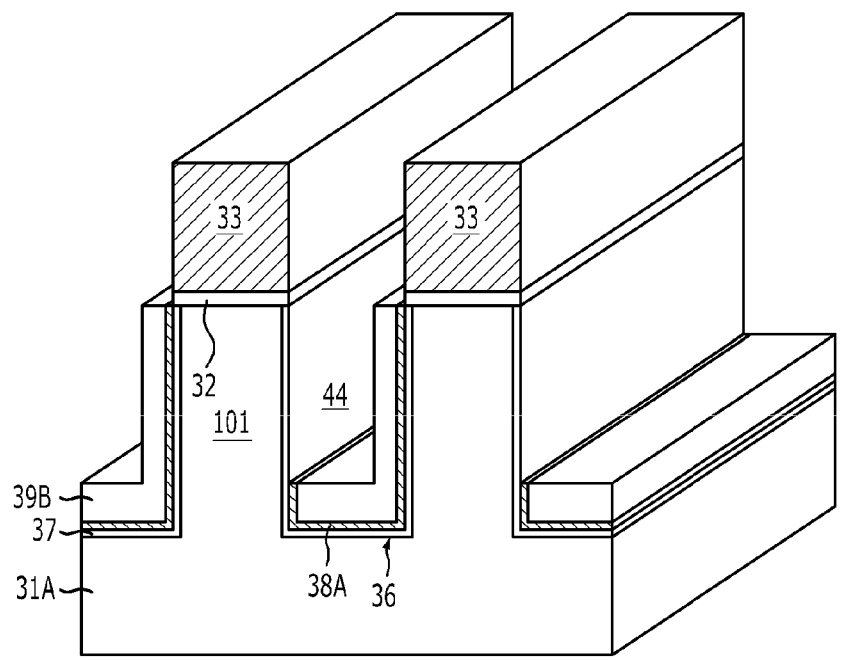
Figure 2M:
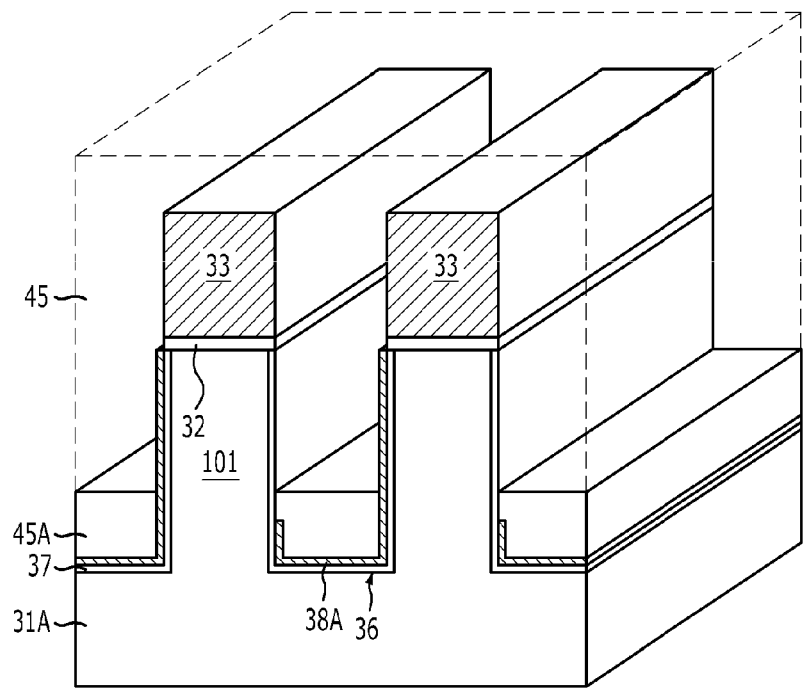
Figure 2N:
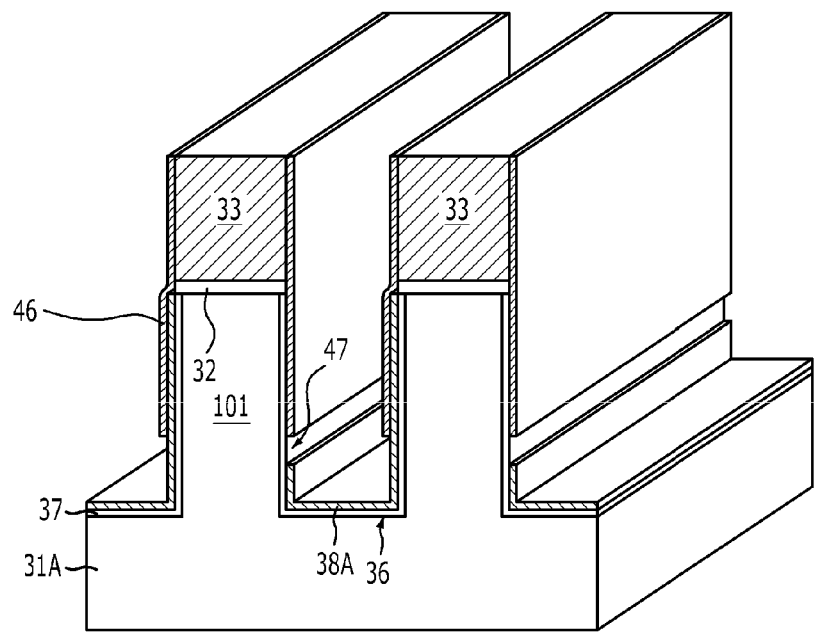
Figure 2O:
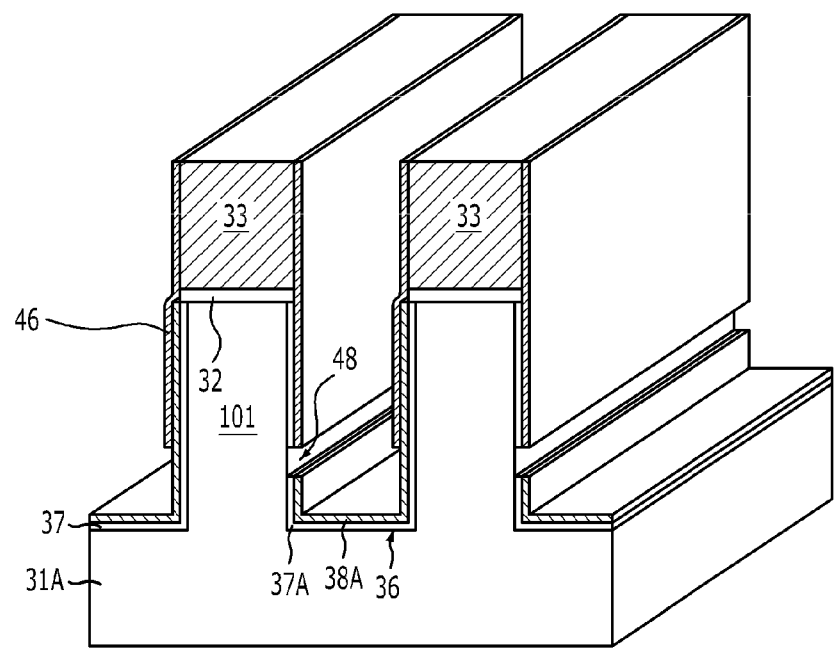
Figure 2P:
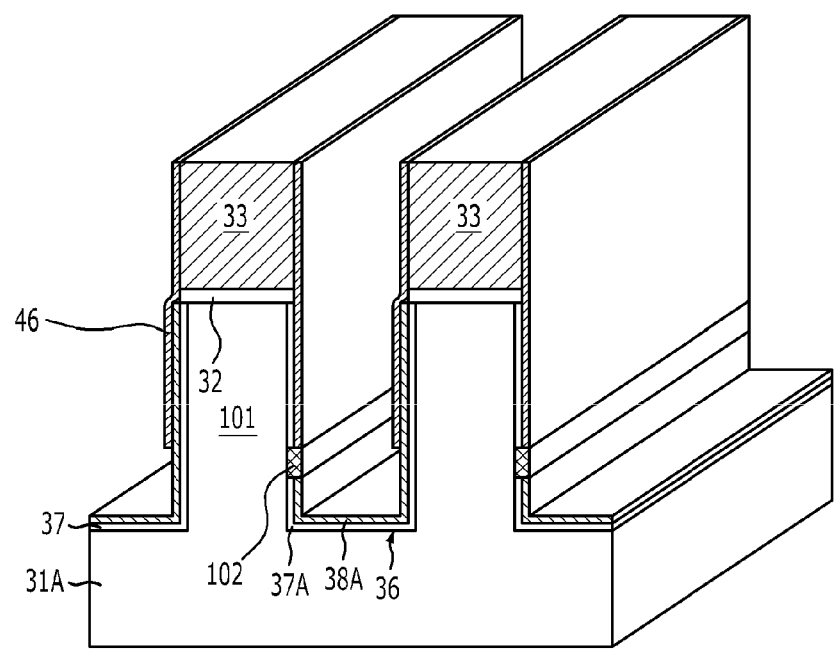
Figure 2Q:
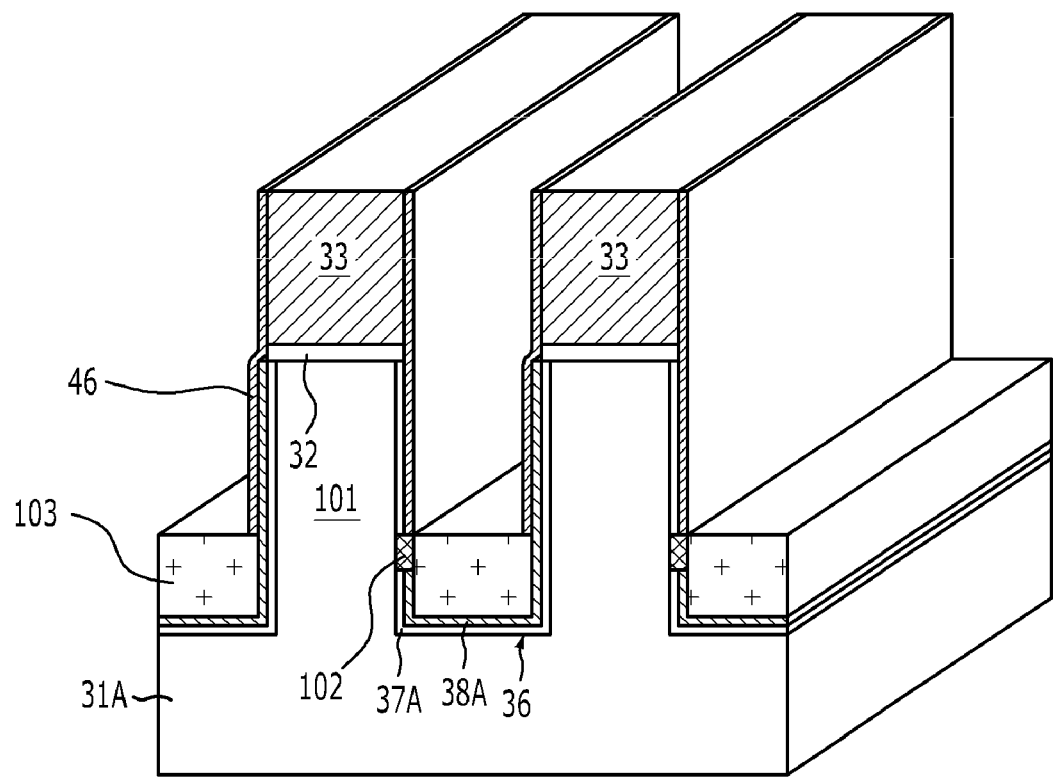

FIGS. 2A to 2Q are cross-sectional perspective views illustrating a method for forming a buried bitline of a semiconductor device in accordance with an embodiment of the present invention.

Referring to FIG. 2A, a pad layer 32 is formed on a semiconductor substrate 31. The pad layer 32 may include an oxide layer.

Hard mask layers 33 and 34 are formed on the pad layer 32. The multi-layered hard mask layer may be a multi-layered structure that includes a nitride layer and an oxide layer. For example, the hard mask nitride (HM nitride) layer 33 and the hard mask oxide (HM oxide) layer 34 may be sequentially stacked. According to an example, a hard mask silicon oxynitride (HM SiON) layer and a hard mask carbon (HM carbon) layer may be further stacked on the hard mask oxide layer 34 (not shown). A first photoresist pattern 35 is formed on the hard mask oxide layer 34. The first photoresist pattern 35 is formed in a line-space type (that is, lines with spaces in-between) and is also referred to as "a buried bitline mask."

The multi-layered hard mask layer is etched using the first photoresist pattern 35 as an etch barrier, and the pad layer 32 is etched. In etching the pad layer 32, the shape of the first photoresist pattern 35 is transferred and therefore the pad layer 32 is also formed in a line-space type. The pad layers before and after the etching process are denoted by a reference numeral 32.

Referring to FIG. 2B, the first photoresist pattern 35 is subsequently removed by a photoresist stripping process.

A trench etch process is performed using the multi-layered hard mask layer as an etch barrier. Specifically, a trench 36 is formed by etching the semiconductor substrate 31 using the hard mask nitride layer 33 and the hard mask oxide layer 34 as an etch barrier. The trench 36 defines a plurality of active regions 101 isolated from one another. The substrate where the trench 36 and the plurality of active regions 101 are formed is denoted by a reference numeral 31A.

Such a trench etch process is referred to as a "BBL trench etch" process. The hard mask layer remaining after the BBL trench etch process includes the hard mask nitride layer 33 and the hard mask oxide layer 34.

Since the active regions 101 are also formed by the multi-layered hard mask layer to which the shape of the first photoresist pattern 35 is transferred, they are patterned as a line-space type. Thus, the active regions 101 are formed in a line type, and the adjacent active regions 101 are isolated from each other by the line type trench 36.

The BBL trench etch process is performed using an anisotropic etch process. When the semiconductor substrate 31 is a silicon substrate, the anisotropic etch process may be performed using a plasma dry etch process which uses $Cl_2$ gas, HBr gas, or a mixture thereof.

Through the above-described BBL trench etch process, the plurality of active regions 101 isolated from one another by the trench 36 are formed on the semiconductor substrate 31A.

Referring to FIG. 2C, a wall oxidation process is performed to form a wall oxide layer 37 on the active regions 101 and the semiconductor substrate 31A. The wall oxidation process for forming the wall oxide layer 37 is performed at a temperature ranging from approximately 700° C. to approximately 900° C. under $O_2$ or $O_2/H_2$ atmosphere.

A first liner nitride layer 38 is deposited over a resulting structure where the wall oxide layer 37 is formed. The first liner nitride layer 38 may be formed at a temperature ranging from approximately 600° C. to approximately 800° C. at a pressure ranging from approximately OA torr to approximately 6 torr under dichlorosilane (DCS) and $NH_3$ atmosphere.

A first gap-fill layer 39 is formed on the first liner nitride layer 38 to gap-fill the trench 36 between the active regions 101. The first gap-fill layer 39 may include an undoped polysilicon layer which will be removed after a subsequent process.

Referring to FIG. 2D, the first gap-fill layer 39 is planarized by a chemical mechanical polishing (CMP) process until the surface of the hard mask nitride layer 33 is exposed. An etch-back process is additionally performed to obtain a first residual gap-fill layer 39A having a certain height. In this case, the first residual gap-fill layer 39A may be higher than or equal to the bottom contact surface of the pad layer 32 and the active region 101 in height.

As such, when the etch-back process is performed to form the first residual gap-fill layer 39A, the hard mask nitride layer 33 protrudes in a protrusion shape. The hard mask oxide layer 34 is removed during the CMP process, and the first liner nitride layer 38 disposed on the top surface and side of the hard mask layer 34 is also polished, thereby obtaining a first residual liner nitride layer 38A. Accordingly, the first residual liner nitride layer 38a is high enough to cover the side of the hard mask nitride layer 33.

Referring to FIG. 2E, a second liner nitride layer 40 is formed to cover the protrusion of the hard mask nitride layer 33. The second liner nitride layer 40 may be formed at a temperature ranging from approximately 600° C. to approximately 800° C. at a pressure ranging from approximately 0.1 torr to approximately 6 torr under DCS and $NH_3$ atmosphere.

A spacer insulation layer 41 is formed on the second liner nitride layer 40. The spacer insulation layer 41 is formed at a relatively low temperature so as to obtain better step coverage. For example, the spacer nitride layer 41 is formed using a CVD process or an atomic layer deposition (ALD) process which may deposit a layer at a temperature ranging from approximately room temperature to approximately 400° C. The spacer insulation layer 41 includes a material having an etch selectivity during a subsequent process of etching the first residual gap-fill layer 39A. According to an example, the first residual gap-fill layer 39A may be a polysilicon layer and the spacer insulation layer 41 may be an insulation layer including an oxide layer.

Referring to FIG. 2F, the spacer insulation layer 41 is dry etched to form a spacer 41A. The spacer 41A is formed on both sides of a protrusion of the hard mask nitride layer 33.

In the dry etch process for forming the spacer 41A, an etch gas including a mixture of a carbon fluoride ($C_xF_y$) gas and an oxygen gas is used as a main gas, and an additive gas including any one of $N_2$, COS, $SO_2$, CO and Ar is used as a passivation gas in order to form a vertical profile. In order to remove the residue after the dry etch process, a wet cleaning process is performed using any one of $NH_4OH$, $H_2SO_4$, and $H_2O_2$.

As described above, the spacer 41A may be formed by the deposition and etching of the oxide layer. As an alternative method for forming the spacer 41A, an oxidation process may be performed after the deposition of the polysilicon layer. In this case, however, uniform thickness of the spacer 41A may be degraded compared to the method of forming the spacer 41A by the deposition and etching of the oxide layer.

Referring to FIG. 2G, an etch barrier 42 is formed over a resulting structure with the spacer 41A. The etch barrier 42 may include an undoped polysilicon layer as a material which serves as an etch barrier in removal of a subsequent spacer. The etch barrier 42 is formed along the profile of the resulting structure with the spacer 41A.

Referring to FIG. 2H, a tilt ion implantation process 43 is performed to implant dopant at a certain tilt angle. Through the tilt ion implantation process 43, dopant is implanted into a portion of the etch barrier 42.

The tilt ion implantation process 43 is performed at a certain angle α with respect to a vertical axis 43A of the semiconductor substrate 31A. The certain angle α is in a range from approximately 5° to approximately 30°. Ion beams are partially screened by the protrusion of the hard mask nitride layer 33. Therefore, while a portion of the etch barrier 42 is doped, a remaining portion of the etch barrier 42 remains undoped. For example, ion-implanted dopant is a P-type dopant (-e.g., boron (B) where $BF_2$ is used as a dopant source for boron ion implantation). As a result, a portion of the etch barrier 42 remains undoped, and the undoped portion is a region adjacent to the left side of the hard mask nitride layer 33 from the perspective of one looking out from the page of the FIG. 2H.

A portion of the etch barrier 42, which is formed on the hard mask nitride layer 33 by the tilt ion implantation 43 of the dopant, and a portion of the etch barrier 42 adjacent to the right side of the hard mask nitride layer 33 become a doped etch barrier 42A. The remaining portion of the etch barrier 42 becomes an undoped etch barrier 42B.

Referring to FIG. 2I, a wet cleaning process is performed to remove the undoped etch barrier 42B. More specifically, an etch rate of the polysilicon layer used as the etch barrier is different depending on whether the dopant is present. In particular, a wet etch rate is relatively fast in the undoped polysilicon layer. Therefore, the undoped polysilicon layer is selectively removed using a high-selectivity chemical which may wet etch only the undoped polysilicon layer.

When the undoped etch barrier 42B is removed, only the doped etch barrier 42A remains. The doped etch barrier disposed at a boundary between the undoped etch barrier 42B and the doped etch barrier 42A may be partially damaged. Meanwhile, during the wet etch process of removing only the undoped etch barrier 42B, the spacer 41A serves as a barrier and thus prevents the surrounding material from being damaged.

Referring to FIG. 2J, the second liner nitride layer 40 is dry etched to expose the surface of the first gap-fill layer 39A.

A cleaning process is performed to remove the spacer 41A. Consequently, the residual spacer 41B remains only on the left side of the hard mask nitride layer 33. Since the residual spacer 41B is covered with the doped etch barrier 42A, it is not removed during the cleaning process and remains after the cleaning process.

When the cleaning process is completed, a first residual liner nitride layer 38A and a second residual liner nitride layer 40A, the spacer 41B, and the doped etch barrier 42A remain on the left side of the hard mask nitride layer 33, and the first residual liner nitride layer 38A and the second residual liner nitride layer 40A remain on the right side of the hard mask nitride layer 33. The doped etch barrier 42A also remains on the hard mask nitride layer 33.

Referring to FIG. 2K, the first residual gap-fill layer 39A is etched to a certain depth by an etch-back process to thereby form a first final gap-fill layer 39B. Therefore, a side trench 44 formed at one side of the active region 101 is opened from a certain height. Since the doped etch barrier 42A (in FIG. 2J) is a polysilicon layer, it is simultaneously removed during the etching of the first residual gap-fill layer 39A. Consequently, due to the etch process in opening the side trench 44, the first residual liner nitride layer 38A and a second final liner nitride layer 40B remain on both sides and top surface of the hard mask nitride layer 33, and the spacer 41B remains on the left side of the hard mask nitride layer 33.

Since the spacer 41B serves as the etch barrier during the etch process for forming the side trench 44, the first residual gap-fill layer 39A may be selectively etched. An edge portion 40C of the second final liner nitride layer 40B may be taken away during the etching of the first residual gap-fill layer 39A. At this time, the first residual gap-fill layer 39A is etched to a position where a subsequent side contact will be formed.

When the first residual gap-fill layer 39A is etched back, only the first final gap-fill layer 39B remains which provides a side trench 44 exposing one side of the adjacent active region 101

Referring to FIG. 2L, the second final liner nitride layer 40B is removed by a cleaning process. At this time, the first residual liner nitride layer 38A is also removed. Therefore, the first residual liner nitride layer 38A adjacent to both sides and top surface of the hard mask nitride layer 33, e.g., the protrusion of the hard mask nitride layer 33, may be completely removed. Furthermore, the remaining first final liner nitride layer 38B remains where it contacts and is shielded by the first final gap-fill layer 39B. In removing the first residual liner nitride layer 38A while the wall oxide layer 37 remains on one side of the active region 101, a wet etch process may be applied, or a dry etch process with an etch selectivity to the oxide layer may be applied.

Referring to FIG. 2M, after removing the first final gap-fill layer 39B, a resulting structure is gap-filled with a second gap-fill layer 45. The second gap-fill layer 45 may include an undoped polysilicon layer.

The second gap-fill layer 45 is planarized by a CMP process or the like until the surface of the hard mask nitride layer 33 is exposed, and it is etched back so that the second gap-fill layer 45 remains with a certain height. Consequently, the second residual gap-fill layer 45A with a certain height remains. In particular, an etch-back depth of the second residual gap-fill layer 45A may be selected to limit a space where a subsequent side contact will be formed. That is, when the second residual gap-fill layer 45A is etched back, the hard mask nitride layer 33 and both sides of the active region 101 are exposed. The wall oxide layer 37 still remains on one side of the active region 101.

Referring to FIG. 2N, a third liner nitride layer is formed over a resulting structure, and is selectively etched to expose the surface of the second residual gap-fill layer 45A. Therefore, a double-layered insulation layer structure including the wall oxide layer 37 and the third liner nitride layer 46 is formed on the right side of the active region 101. A three-layered insulation layer structure including the wall oxide layer 37, the second final liner nitride layer 38B, and the third liner nitride layer 46 is formed on the left side of the active region 101.

The third liner nitride layer 46 is formed at a temperature ranging from approximately 600° C. to approximately 800° C. at a pressure ranging from approximately 0.1 torr to approximately 6 torr under DCS and $NH_3$ atmosphere.

The second residual gap-fill layer 45A is removed. Therefore, a line type opening 47 (that is, an opening forming a line) is formed at a portion of one side of the active region 101. The opening 47 is formed at a space where the second gap-fill layer 45 between the first final liner nitride layer 38B and the third liner nitride layer 46 is removed. The critical dimension of the opening 47 is determined by the thickness of the second gap-fill layer 45A.

Referring to FIG. 2O, the wall oxide layer 37 exposed by the opening 47 is selectively removed. Therefore, a contact region 48 is formed which exposes a portion of one side of the active region 101 in a line type. In order to form the contact region 48, the wall oxide layer 37 may be removed by a cleaning process. For example, if a cleaning process is performed using HF, buffered oxide etchant (BOE), or the like, the wall oxide layer 37 may be selectively removed without damaging the surrounding liner nitride layers. Other than for areas corresponding to the contact region 48, the wall oxide layer 37 remains as indicated by a reference numeral 37A.

Referring to FIG. 2P, a side contact 102 buried in the contact region 48 is formed. The side contact 102 may include metal silicide. Examples of the metal silicide may include titanium silicide ($TiSi_2$), cobalt silicide ($CoSi_2$), and nickel silicide (NiSi). In order to prevent degradation caused by a subsequent high-temperature thermal treatment, cobalt silicide ($CoSi_2$) having superior thermal stability may be used.

As described above, the side contact 102 forms a one side contact structure. That is, the side contact 102 is formed only on one side of the active region 101.

Although not illustrated, before the side contact 102 is formed, a cell junction may be previously formed. The cell junction may be formed by depositing a doped polysilicon layer and diffusing the deposited polysilicon layer through a thermal treatment. Alternatively, the cell junction may be formed in the order of the deposition of an undoped polysilicon layer, the dopant ion implantation, and the thermal treatment.

Referring to FIG. 2Q, a bitline conductive layer is deposited over a resulting structure with the side contact 102. At this time, the bitline conductive layer is deposited over the resulting structure to gap-fill the trench 36 between the active regions 101. The bitline conductive layer includes a metal layer, e.g., a titanium nitride (TiN) layer or a tungsten (W) layer. Alternatively, the bitline conductive layer may be formed by stacking a titanium nitride layer and a tungsten layer.

The bitline conductive layer may be removed to have a certain height, for example, a height where it contacts the side contact 102. Consequently, a buried bitline 103 contacting the side contact 102 is formed. The buried bitline 103 is arranged in parallel to the active region 101, and the active region 101 and the buried bitline 103 are electrically connected together through the side contact 102.

As such, the buried bitline 103 has a relatively low resistance because it is a metal bitline, and the buried bitline 103 fills a portion of the inside of the trench 36 between the active regions 101. Unlike conventional technologies, according to an exemplary embodiment, it is unnecessary to perform a trench process for isolating the buried bitlines from one another. Due to the 1-cell 1-bitline structure, the exemplary embodiment may be applied to the $4F^2$ design rule and allow high integration of the semiconductor device.

In accordance with the above-described embodiment, since the spacer including an oxide layer is used, it may serve as a barrier when the side trench is formed. The thickness of the spacer may be relatively uniform compared to the case where the side trench is formed by oxidizing the polysilicon layer.

Furthermore, after the spacer including the oxide layer is formed, the deposition of the undoped polysilicon layer and the tilt ion implantation are performed, and only the undoped polysilicon layer is wet etched. Therefore, even though the selectivity of the undoped polysilicon layer to the doped polysilicon layer may be relatively low, it does not significantly influence the pattern formation.

Moreover, the fabrication time and cost may be reduced because the process of oxidizing the polysilicon layer is omitted.

Consequently, it is possible to obtain the simplified fabrication process, the improved pattern uniformity, and the high selectivity between the layer materials.

Meanwhile, in accordance with another embodiment of the present invention, instead of forming the spacer using the oxide layer, the doped etch barrier is formed by the deposition of the undoped polysilicon layer and the tilt ion implantation, and undoped etch barrier areas are removed by a wet cleaning process. The side portion may be formed using only the residual doped etch barrier as an etch barrier. In this case, however, the tilt ion implantation may make it difficult to control the critical dimension of the doped region and the undoped region. Consequently, it may be difficult to form the side portion having uniform depth to position the subsequent contact regions uniformly.

However, as illustrated in FIG. 2K, since the side trench 44 is formed with the spacer 41B (that includes an oxide layer), the side trench 44 may be formed with the uniform depth. Consequently, the subsequent contact regions (48 in FIG. 2O) may be formed to be positioned uniformly.

In accordance with the exemplary embodiments of the present invention, since the spacer including the oxide layer as an etch barrier material is used, the side portion of the active region may be uniformly opened at one side of the active region.

Furthermore, since the buried bitline is formed using a metal layer, its resistance may be reduced. Hence, the operation characteristics of the semiconductor device may not be degraded even though the semiconductor device is further reduced in size.

Moreover, the ohmic-like contact may be formed because the one side contact is applied at the contact region where the metallic buried bitline and the active pillar contacts each other.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   etching a semiconductor substrate using a hard mask layer as a barrier to form a trench defining a plurality of active regions;
   forming a gap-fill layer to gap-fill a portion of the inside of the trench so that the hard mask layer becomes a protrusion;
   forming spacers covering both sides of the protrusion;
   removing one of the spacers using a doped etch barrier as an etch barrier; and
   etching the gap-fill layer using a remaining spacer as an etch barrier to form a side trench exposing one side of the active region.

2. The method of claim 1, wherein the doped etch barrier comprises a doped polysilicon layer.

3. The method of claim 1, wherein the doped etch barrier is formed to cover one of the spacers throughout an undoped polysilicon layer deposition process, a tilt ion implantation process, and a wet etch process.

4. The method of claim 3, wherein the tilt ion implantation process uses boron (B) as a dopant.

5. The method of claim 1, wherein the forming of the spacers comprises:
   forming an insulation layer over a resulting structure with the protrusion after the forming of the gap-fill layer; and
   etching the insulation layer by a space etch process to form the spacers on both sides of the protrusion.

6. The method of claim 5, wherein the insulation layer comprises an oxide layer.

7. The method of claim 6, wherein the oxide layer is deposited at a temperature ranging from approximately room temperature to approximately 400° C.

8. The method of claim 6, wherein the oxide layer is deposited using a chemical vapor deposition (CVD) process or an atomic layer deposition (ALD) process.

9. The method of claim 5, wherein the spacer etch process is performed using a carbon fluoride gas and an oxygen gas as a main gas.

10. The method of claim 9, wherein the spacer etch process is performed using one of $N_2$, COS, $SO_2$, CO, and Ar as an additive gas.

11. The method of claim 5, further comprising performing, after the spacer etch process, a wet cleaning for removing a residue.

12. The method of claim 11, wherein the wet cleaning process is performed using one of $NH_4OH$, $H_2SO_4$, and $H_2O_2$.

13. The method of claim 1, further comprising forming, before the forming of the spacers, a liner nitride layer over a resulting structure with the protrusion after the forming of the gap-fill layer.

14. The method of claim 1, further comprising, after etching the gap fill layer:
   forming a contact region opening on one side of the active region, which is exposed by the side trench;
   forming a side contact buried in the contact region; and
   forming a buried bitline connected to the side contact and filling a portion of the side trench.

* * * * *